United States Patent
Erb

(10) Patent No.: US 7,613,912 B2
(45) Date of Patent: *Nov. 3, 2009

(54) SYSTEM AND METHOD FOR SIMULATING HARDWARE INTERRUPTS

(75) Inventor: David John Erb, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 298 days.

This patent is subject to a terminal disclaimer.

(21) Appl. No.: 11/771,688

(22) Filed: Jun. 29, 2007

(65) Prior Publication Data

US 2007/0288729 A1 Dec. 13, 2007

Related U.S. Application Data

(63) Continuation of application No. 11/002,533, filed on Dec. 2, 2004, now Pat. No. 7,278,014.

(51) Int. Cl.
G06F 9/44 (2006.01)
G06F 9/45 (2006.01)
(52) U.S. Cl. ...................................... 712/244
(58) Field of Classification Search ................ 712/233, 712/234, 243, 244
See application file for complete search history.

(56) References Cited

U.S. PATENT DOCUMENTS

| | | | | | |
|---|---|---|---|---|---|
| 4,777,587 | A | * | 10/1988 | Case et al. | 712/235 |
| 5,564,028 | A | * | 10/1996 | Swoboda et al. | 712/227 |
| 5,724,566 | A | * | 3/1998 | Swoboda et al. | 712/245 |
| 5,729,727 | A | * | 3/1998 | Suzuki | 712/233 |
| 5,832,205 | A | * | 11/1998 | Kelly et al. | 714/53 |
| 5,922,070 | A | * | 7/1999 | Swoboda et al. | 712/244 |
| 6,047,351 | A | * | 4/2000 | Cheng | 710/266 |
| 6,209,086 | B1 | * | 3/2001 | Chi et al. | 712/244 |
| 6,604,188 | B1 | * | 8/2003 | Coon et al. | 712/24 |
| 6,728,865 | B1 | * | 4/2004 | Coon et al. | 712/204 |
| 6,738,892 | B1 | * | 5/2004 | Coon et al. | 712/24 |
| 6,807,621 | B2 | * | 10/2004 | Strombergson et al. | 712/23 |
| 6,990,569 | B2 | * | 1/2006 | Hill | 712/227 |
| 7,013,383 | B2 | * | 3/2006 | Shelor | 712/244 |
| 2002/0038417 | A1 | * | 3/2002 | Strombergsson et al. | 712/239 |
| 2003/0084272 | A1 | * | 5/2003 | Hill | 712/227 |
| 2003/0163669 | A1 | * | 8/2003 | DeLano | 712/24 |
| 2005/0216703 | A1 | * | 9/2005 | Dieffenderfer et al. | 712/207 |
| 2006/0080661 | A1 | * | 4/2006 | Brokenshire et al. | 718/100 |

* cited by examiner

*Primary Examiner*—Aimee J Li
(74) *Attorney, Agent, or Firm*—VanLeeuwen & VanLeeuwen; Matthew B. Talpis

(57) ABSTRACT

A system and method is provided to simulate hardware interrupts by inserting instructions into a stream of instructions where a "no operation" (or NOOP) instruction would normally be inserted. The instruction is inserted is a conditional branch instruction, called a BISLED, that branches if there is external data in a known memory area. In one embodiment, the processor has at least two pipelines that need to be aligned so that certain instructions are scheduled for the first pipeline and other instructions are scheduled for the other. In this embodiment, the BISLED also serves the purpose of re-aligning the instruction stream so that instructions are placed in the correct pipeline based upon the function performed by the instruction.

20 Claims, 5 Drawing Sheets

Example Alignment. In this example architecture, "add" and "nop" instructions are even (pipe 0) instructions, and "load", "lnop", and "bisled" are odd (pipe 1) instructions.

SYSTEM AND METHOD FOR SIMULATING HARDWARE INTERRUPTS

RELATED APPLICATION

This Application is a Continuation of U.S. patent application Ser. No. 11/002,533 filed Dec. 2, 2004 now U.S. Pat. No. 7,278,014 and published on Jul. 6, 2006 as Publ. No. US-200600149943-A1, with the parent application and this Continuation having both the same inventor and assignee.

BACKGROUND OF THE INVENTION

1. Technical Field

The present invention relates in general to a system and method for simulating hardware interrupts. More particularly, the present invention relates to a system and method for a compiler to insert external branch statements in code operating in an environment where there are no hardware interrupts.

2. Description of the Related Art

Originally, computer systems were single-task devices that performed one set of instructions until the operation was complete. Processors were developed that provided the ability to interrupt a process by using a processor-enabled hardware interrupt. The operating system, or the individual process, receives the interrupt, determines what is being requested, and handles the interrupt. In general purpose computing environments, interrupts often occur many times per second. Interrupting processes allows the computing system to multitask and appear that multiple processes are running concurrently when, instead, each process is sharing the processor and running in a small time slice before the processor switches to a different process. However, even in modern computer system, some processors do not have interrupt capabilities. The lack of interrupt capabilities make it difficult to task switch in these environments. A program running on a non-interruptable processor typically must poll, or look for, a request that is waiting to be processed. If a program is poorly written and does not poll for such interruptions frequently enough, the request waits for a long period of time.

One environment that provides fewer hardware interrupt capabilities is a heterogeneous processor environment that includes a primary processing unit (PU) and one or more secondary synergistic processing units (SPUs). The PU boots-up and initializes the computer system during which time the PU loads an operating system. The PU has interrupt capabilities and the operating system that runs on the PU is able to switch from one task to another. Conversely, the SPU runs extremely fast in comparison to the PU but has a limited instruction set and does not have hardware interrupt capabilities.

The operating system running on the PU performs basic tasks, such as recognizing input from a keyboard, sending output to a display screen, keeping track of files and directories on a disk, and controlling peripheral devices, such as disk drives and printers. The operating system includes a kernel that is a central module of the operating system and is responsible for memory management, process management, task management, and disk management.

The kernel loads a PU program into the PU's internal memory. During the loading process, the kernel identifies a runtime loader that corresponds to the PU program. The runtime loader is responsible for loading objects, resolving symbols, and loading other files (i.e. data, programs) that correspond to the PU program. The kernel loads the runtime loader into the PU's internal memory and passes control to the runtime loader. The runtime loader identifies files that the PU program depends, such as an SPU file. The runtime loader loads the SPU file into the PU's internal memory, and extracts a processor identifier from the SPU file's header. For example, the SPU file may be an ELF formatted file in which case the file includes a "machine type SPU" in its ELF header which is a processor identifier that correlates the file to an SPU.

The runtime loader determines that the SPU file should run on an SPU based upon the SPU file's processor identifier, and sends the SPU file to an SPU using a DMA command. The SPU receives the SPU file and stores it in the SPU's local memory. The SPU begins executing the SPU file, and, in turn, loads an SPU runtime loader in its internal memory. However, because the SPU does not have hardware interrupts, the program running in the SPU is not able to receive and process an interrupt, the program must either poll for waiting requests or, if the program does not look for waiting requests, the program runs on the SPU until it completes.

During the SPU file's execution, the SPU runtime loader retrieves and loads files in which the SPU file depends. For example, the SPU file may be a graphics program whereby it requires a plug-in module for manipulating data. The SPU runtime loader recognizes that the SPU file requires a plug-in, and sends a request to the PU. The PU receives the request, and retrieves the plug-in from system memory. The PU program sends the plug-in to the SPU runtime loader using a DMA command whereby the SPU runtime loader stores the plug-in in SPU internal memory. The SPU file may also receive data from the PU program using the same technique as described above. Again, because the SPU does not support hardware interrupts, the data waiting to be processed by the SPU program waits for the SPU program to poll memory and determine that the data is waiting.

One approach to handling the challenge of signaling a processor in this environment would be to add hardware interrupt capabilities to the processors. This, however, adds additional unwanted complexity to the SPUs. Another approach is for programs to poll for requests, as described above. The trouble with this approach is that if programs poll too frequently for requests, too much processing time is wasted performing the polls, however, if the programs do not poll frequently enough, the request waits too long to be processed.

What is needed, therefore, is a system and method for simulating an interrupts in the SPU. Furthermore, what is needed is a system and method that automatically adds the simulated interrupts when compiling a program without relying on individual programmers to code the interrupt simulation. Finally, what is needed is a system and method that simulates hardware interrupts without adding undue processing requirements to programs running on the SPU.

SUMMARY

It has been discovered that the aforementioned challenges are resolved by using a compiler to insert specific branch instructions into the instruction stream. Moreover, the aforementioned challenges are further resolved by inserting the branch instructions in slot in the instruction stream that would otherwise be unused because of the plurality of pipelines used in the SPU. Inserting branch instructions instead of "no operation" instructions does not impose a performance penalty because the branch instructions used only branch if external data is waiting. Furthermore, because branch instructions are inserted in slots that would otherwise be used by "no operation" instructions, there is no increase in the program size of the compiled code.

When compiling programs for a processor, such as the SPU, that includes two or more pipelines, the instructions are shifted in order to align with the pipeline requirements. For example, in a processor with two pipelines, the "add" instruction may be an even (pipeline 0) instruction and the "load" instruction may be an odd (pipeline 1) instruction. Traditional compilers insert "no operation" ("noop") instructions in order to align the instructions. In the example above, if two "add" instructions are concurrent, a traditional compiler would insert a "noop" instruction between the "add" instructions so that both "add" instructions are scheduled in pipeline 0 rather than one of the instructions being scheduled for pipeline 0 and the other for pipeline 1 (as pipeline 1 does not have an adder and does not support "add" instructions).

During compilation, Branch Indirect and Set Link if External Data (BISLED) instructions are used instead of "noop" instructions to shift data so that instructions are in the correct pipelines. An interrupt handler is registered to handle simulated interrupts. A known location, such as Register 0, is used to store external data. As a result of compilation, BISLED instructions are sprinkled throughout the code. When a BISLED instruction is executed, the processor checks for external data at the known location (e.g., Register 0). If data is in the known location, a branch is made to the registered interrupt handler. If there is no data in the location, a branch is not made. In this fashion, another program can interrupt the program running in the SPU by placing data in the known location. In one embodiment, the data placed in the known location is also used as an input to the interrupt handler.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DETAILED DESCRIPTION

The following is intended to provide a detailed description of an example of the invention and should not be taken to be limiting of the invention itself. Rather, any number of variations may fall within the scope of the invention which is defined in the claims following the description.

Figure 1A:
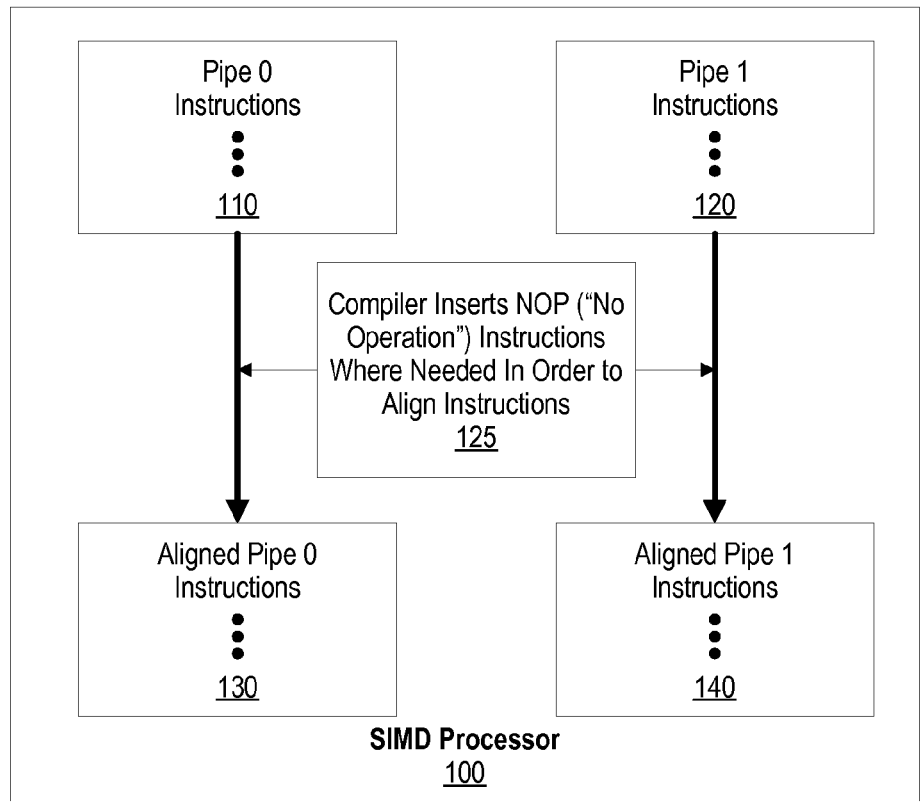
FIG. 1A is a diagram showing a prior art implementation of shifting instructions.

FIG. 1A is a diagram showing a prior art implementation of shifting instructions. In the example shown using a SIMD processor 100 with two pipelines. Instructions in a program are either pipeline 0 or pipeline 1 instructions (110 and 120 respectively) depending on the type of instruction. For example, processor 100 may only have one "adder" to perform "add" instructions. If the processor's adder is connected to pipeline 0, then all add instructions must be in pipeline 0 in order to be processed. In order to align the instructions so that each pipeline 0 instruction follows a pipeline 1 instructions and vise-versa, the compiler inserts "no-operation" ("noop" or "nop") instructions into the instruction stream so that the resulting instructions are aligned with the appropriate pipeline (aligned pipeline 0 instructions 130 and aligned pipeline 1 instructions 130). Using the example above, if there are two "add" instructions back-to-back with the first "add" instruction scheduled for pipeline 0, then compiler 125 inserts a "noop" instruction between the two "add" instructions so that the second "add" instruction is shifted to also be a pipeline 0 instruction, rather than a pipeline 1 instruction.

Figure 1B:
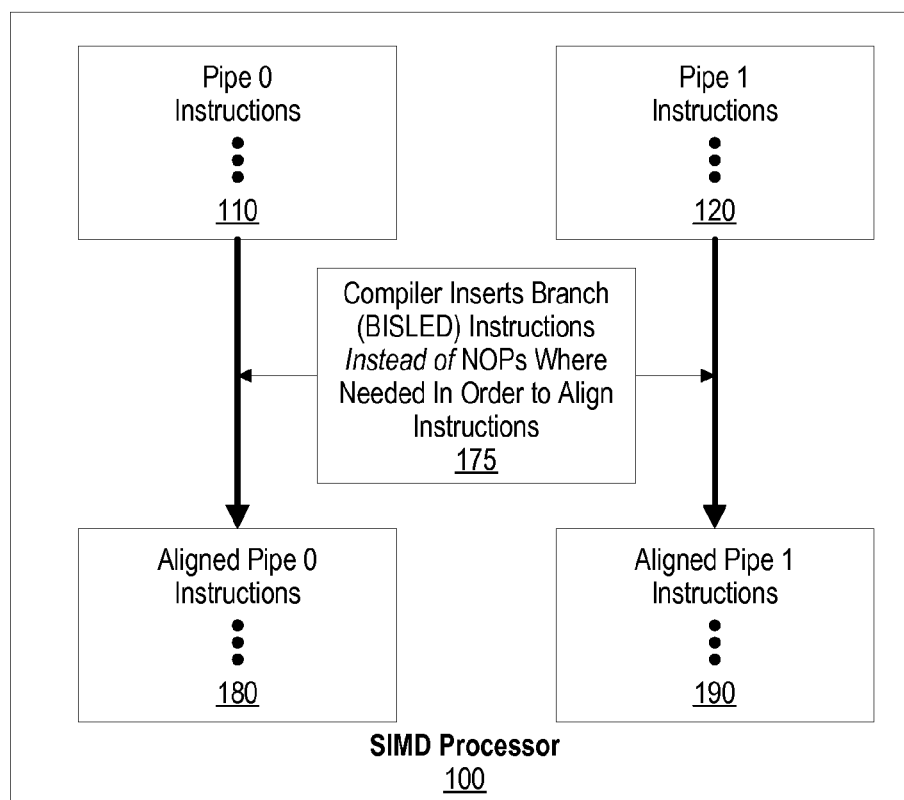
FIG. 1B is a diagram showing shifting instructions using branch instructions.

FIG. 1B is a diagram showing shifting instructions using branch instructions. In contrast to adding "noop" instructions as shown in FIG. 1A, FIG. 1B shows the compiler inserting conditional branch instructions, called "BISLEDs", instead of "noops" in order to align the instructions. While the original instruction streams 110 and 120 are the same, in FIG. 1B the compiler adds the conditional branch instructions at 175 resulting in aligned instructions 180 and 190 that differ from aligned instructions 130 and 140 because the BISLED instruction is used instead of no-operation instructions. In one embodiment of SIMD processor 100, the conditional branch (BISLED) instruction is a pipeline 1 instruction. In this embodiment, the BISLED instructions are only added as pipeline 1 instructions and no-operation instructions are still inserted into the pipeline 0 stream.

Inserting branch instructions instead of "no operation" instructions does not impose a performance penalty because the branch instructions used only branch if external data is waiting. Furthermore, because branch instructions are inserted in slots that would otherwise be used by "no operation" instructions, there is no increase in the program size of the compiled code.

Figure 2:
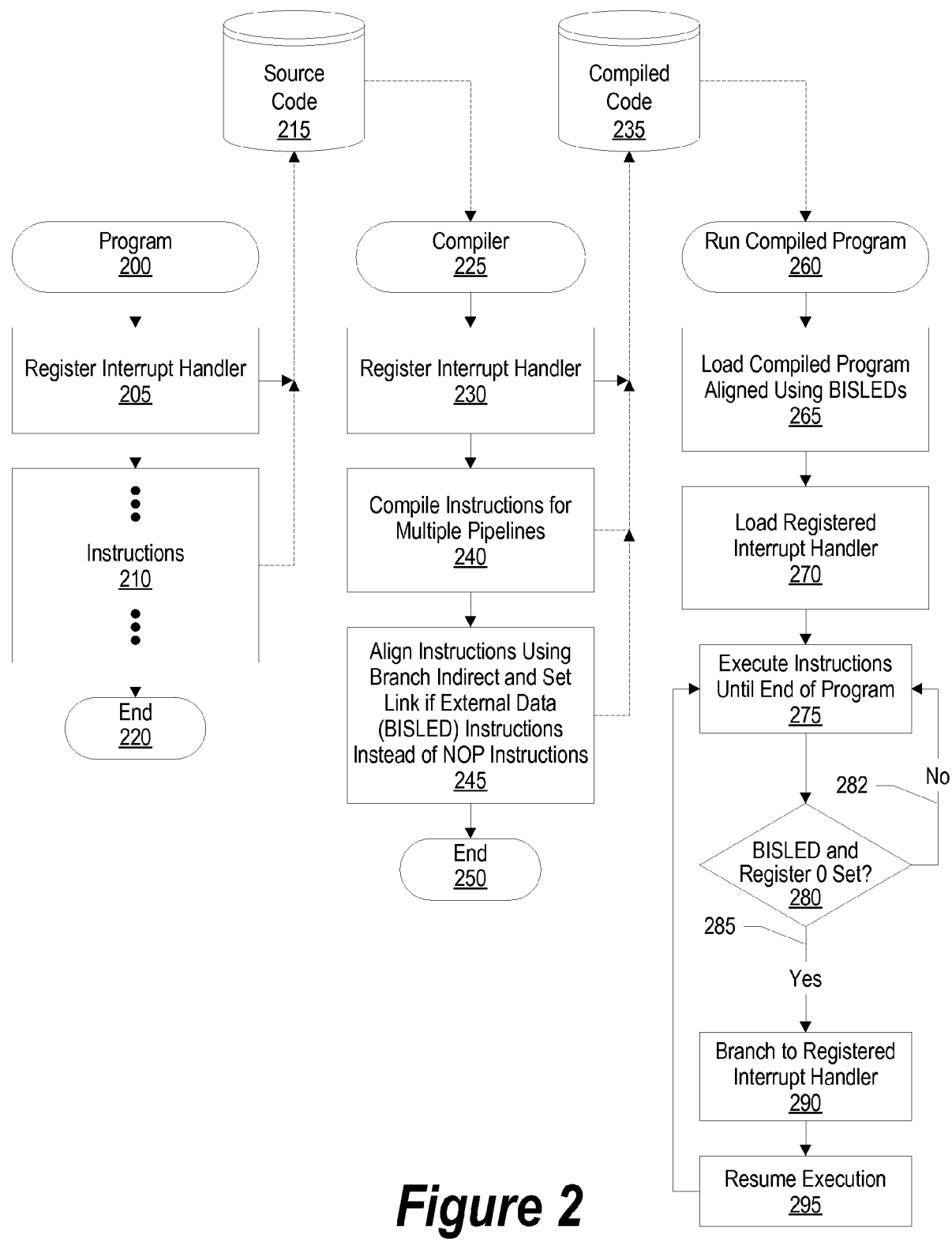
FIG. 2 is a flowchart showing steps taken in creating and executing a program with simulated interrupts.

FIG. 2 is a flowchart showing steps taken in creating and executing a program with simulated interrupts. A programmer writes program 200. The program registers an interrupt handler at step 205 and also codes a variety of other instructions intended for execution by the processor (instructions 210) Program creation ends at 220 and results in source code file 215.

Compiler 225 is used to compile source code 215. The interrupt handler coded by or referenced by the source code is registered at 230. The source code instructions are compiled for a processor with multiple pipelines at 240. At step 245, the compiled instructions are aligned according to which pipeline of the processor is used to execute the instruction. For example, if there are two concurrent instructions that are both pipeline 0 instructions, then a BISLED instruction is inserted between the instructions so that they are aligned correctly and will be executed in pipeline 0 and the BISLED instruction is executed in pipeline 1. As mentioned previously, in one embodiment, the BISLED instruction is a pipeline 1 instruction. In this embodiment, if two pipeline 1 instructions are concurrent in the instruction stream, then at step 245 a no-operation (noop) instruction is inserted as a pipeline 0 instruction between the two pipeline 1 instructions. Compilation ends at 250 and results in compiled code file 235.

Execution of compiled code commences at 260 where compiled code file 235 (aligned using BISLED instructions) is loaded in memory at step 265. At step 270, the registered interrupt handler is loaded. The interrupt handler may be a routine included in compiled code 235 or might be a separate compiled program that is also loaded along with the compiled code.

At step 275, instructions in the program are executed until the end of the program. In a processor environment with no hardware interrupts, the program will not be interrupted by the processor for another event, such as a time slice. A determination is made as to whether the instruction is a BISLED instruction and a known external data area, such as Register 0, is set (decision 280). Many of the BISLED instructions were sprinkled throughout the compiled code by the compiler in step 245. If the instruction is not a BISLED instruction or if it is a BISLED instruction but the known external data area has not been set, then decision 280 branches to "no" branch 282 and the processor continues to execute the program's instructions. However, if the instruction is a BISLED instruction and the known data area has been set, then decision 280 branches to "yes" branch 285 whereupon processing branches to the registered interrupt handler at step 290. When the interrupt handler completes handling the simulated interrupt, execution of the program resumes at 295 and continues until the end of the program or until another simulated interrupt is encountered.

Figure 3:
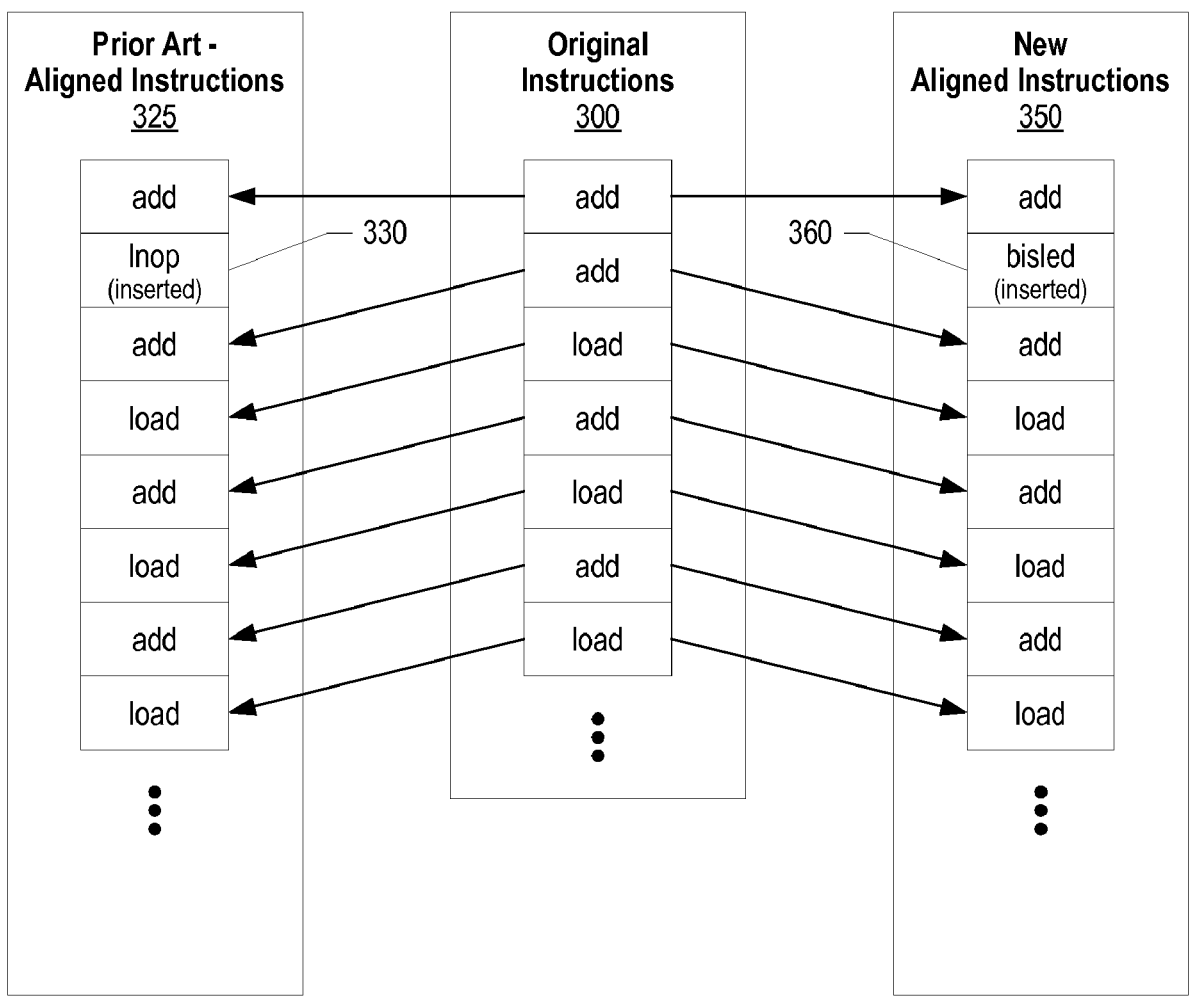
FIG. 3 is a diagram showing instructions being inserted into instruction streams to be executed by a processor with two pipelines.

FIG. 3 is a diagram showing instructions being inserted into instruction streams to be executed by a processor with two pipelines. Original instructions 300 include an instruction stream that is aligned by the compiler. In the example shown, the "add" and right no-operation ("nop") instructions are even instructions executed by pipeline 0 of the processor, and "load", left no-operation ("lnop"), and conditional branch on external data ("bisled") instructions are odd instructions executed by pipeline 1 of the processor.

In the example, original instruction stream 300 is "add", "add", "load", "add", "load", "add", and "load". Because the "add" instruction is an even (pipeline 0) instruction, the second "add" instruction needs to be shifted so that it is aligned with pipeline 0 instructions. In the prior art instruction stream 325, this was accomplished by inserting a left no-operation ("lnop") into slot 330 so that the first two "add" instructions are both aligned as pipeline 0 instructions. Using the invention described herein, new aligned instruction steam 350 inserts a conditional branch on external data ("bisled") instruction in slot 360.

If another program wishes to interrupt the program, the other program would write data to a known location, such as Register 0. When the processor executes new aligned instructions 350, it executes the "add" and "bisled" instructions in pipelines 0 and 1, respectively. The "bisled" instruction would result in a branch to the registered interrupt handler because data was found in the known location (e.g., the data written by the other program to Register 0). Because the compiler sprinkled "bisled" instructions throughout new aligned instruction stream 350 in order to align the instructions for the appropriate pipelines, when another program needs to interrupt the program and writes data to the known location, a branch to the registered interrupt handler will generally take place rather quickly, simulating an interrupt of the program running on a processor that does not have interrupt capabilities.

Figure 4:
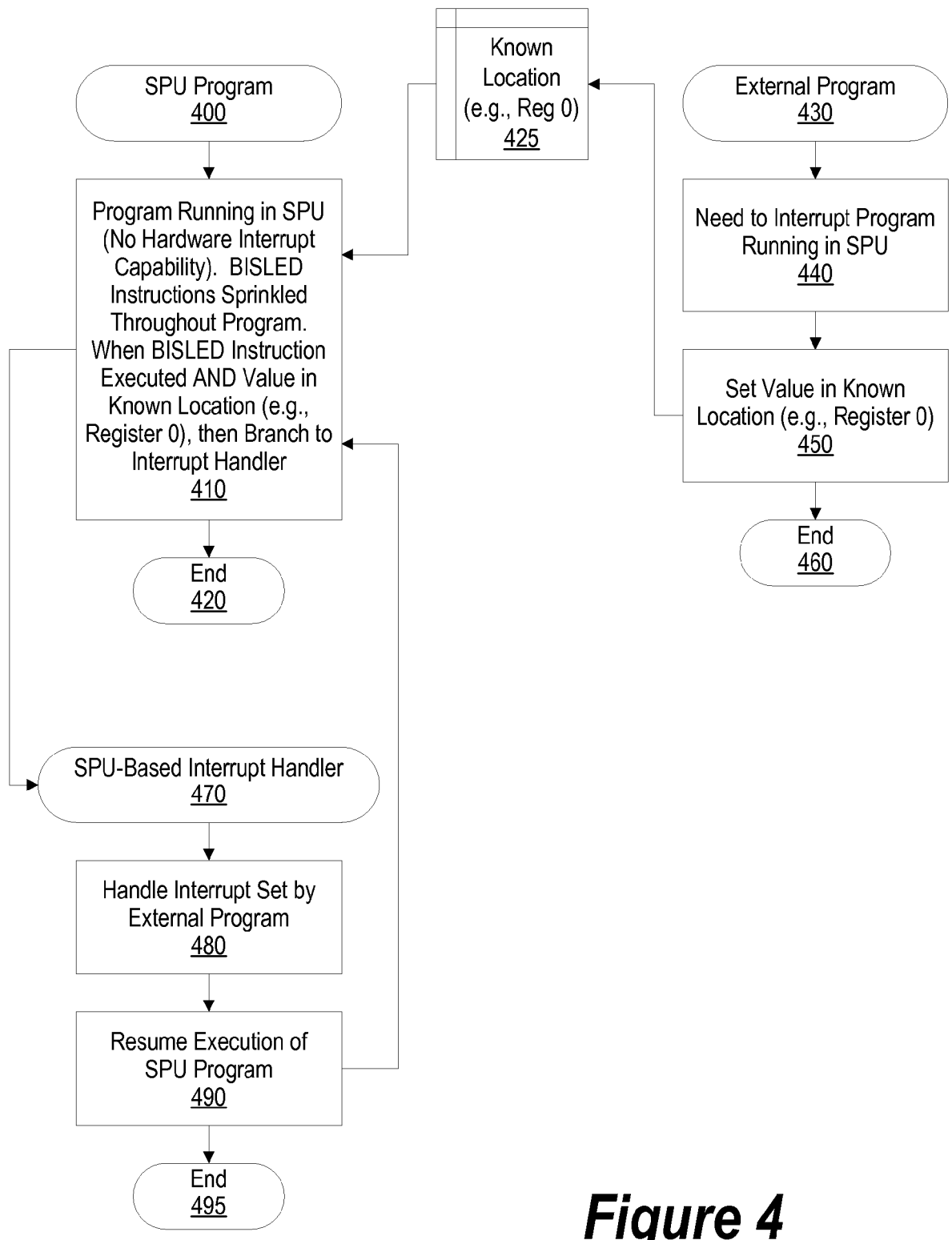
FIG. 4 is a flowchart showing the steps taken to provide a simulated interrupt to a program and branch to a registered interrupt handler.

FIG. 4 is a flowchart showing the steps taken to provide a simulated interrupt to a program and branch to a registered interrupt handler. At 400 a program is executed by the SPU. At step 410, a program running in the SPU (a processor with no hardware interrupt capability) with BISLED instructions sprinkled throughout program by the compiler, as described in FIGS. 2 and 3. When a BISLED instruction is executed AND a value is in known location 425 (e.g., Register 0), then the BISLED causes a branch to the registered interrupt handler 470. Because the SPU does not have processor interrupt capabilities, without polling on events or memory or using the BISLED instructions as described herein, execution of SPU program 400 continues until it ends at 420.

External program 430 is running on another SPU or on a PU within a computer system (or networked computer system). At step 440, the external program discovers the need to interrupt SPU program 400. For example, SPU program 400 may be a program that processes data. When external program 430 has data that it needs to be processed by SPU program 400, at step 450 it writes a value into a known location, such as Register 0 of the SPU on which SPU Program 400 is running. The value it writes to the known location may be the address of the data that the external program needs processed by SPU Program 400. External program 430 can then use the processed data or results from the simulated interrupt before ending at 460.

When external program 430 writes data (such as an address of data that needs processing) to known location 425, the next BISLED instruction executed by SPU program 400 causes a branch to interrupt handler 470. Interrupt handler 470 handles the simulated interrupt set by the external program at step 480. When the interrupt has been handled, at step 490, execution of the SPU program resumes. In addition, the data set in known location 425 is cleared so that the next BISLED instruction in SPU program 400 does not cause another branch to the interrupt handler. In addition, the external program (or another external program) is able to write another value to known location 425 in order to trigger another simulated interrupt. Interrupt handling processing ends at 495 and control is passed back to SPU program 400.

Figure 5:
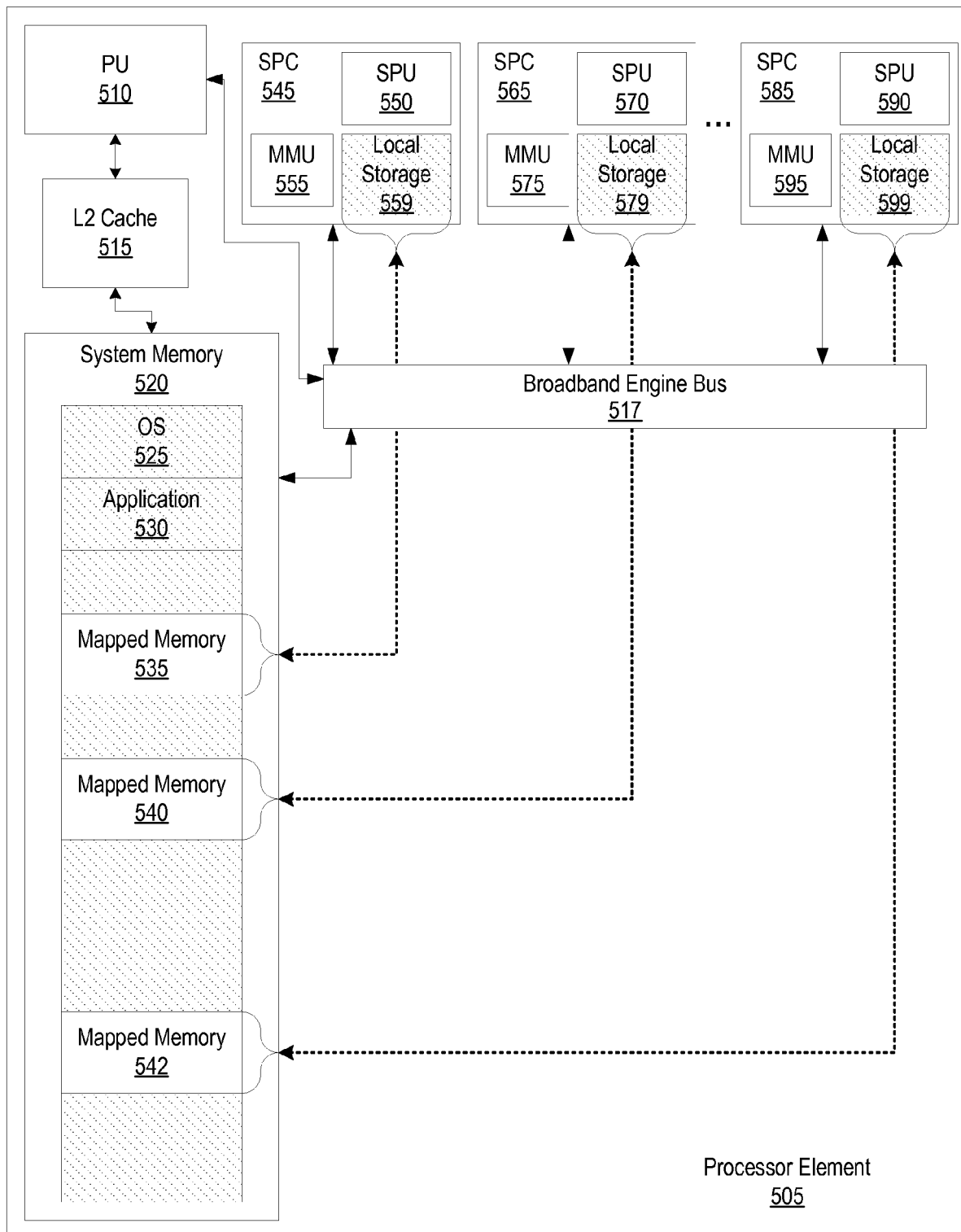
FIG. 5 is a block diagram of an information handling system capable of implementing the present invention.

FIG. 5 is a block diagram of an information handling system capable of implementing the present invention. FIG. 5 is a block diagram illustrating a processing element having a main processor and a plurality of secondary processors sharing a system memory. Processor Element (PE) 505 includes processing unit (PU) 510, which, in one embodiment, acts as the main processor and runs an operating system. Processing unit 510 may be, for example, a Power PC core executing a Linux operating system. PE 505 also includes a plurality of synergistic processing complex's (SPCs) such as SPCs 545, 565, and 585. The SPCs include synergistic processing units (SPUs) that act as secondary processing units to PU 510, a memory storage unit, and local storage. For example, SPC 545 includes SPU 560, MMU 555, and local storage 559; SPC 565 includes SPU 570, MMU 575, and local storage 579; and SPC 585 includes SPU 590, MMU 595, and local storage 599.

Each SPC may be configured to perform a different task, and accordingly, in one embodiment, each SPC may be accessed using different instruction sets. If PE 505 is being used in a wireless communications system, for example, each SPC may be responsible for separate processing tasks, such as modulation, chip rate processing, encoding, network interfacing, etc. In another embodiment, the SPCs may have identical instruction sets and may be used in parallel with each other to perform operations benefiting from parallel processing.

PE 505 may also include level 2 cache, such as L2 cache 515, for the use of PU 510. In addition, PE 505 includes system memory 520, which is shared between PU 510 and the SPUs. System memory 520 may store, for example, an image of the running operating system (which may include the kernel), device drivers, I/O configuration, etc., executing applications, as well as other data. System memory 520 includes the local storage units of one or more of the SPCs, which are mapped to a region of system memory 520. For example, local storage 559 may be mapped to mapped region 535, local storage 579 may be mapped to mapped region 540, and local storage 599 may be mapped to mapped region 542. PU 510 and the SPCs communicate with each other and system memory 520 through bus 517 that is configured to pass data between these devices.

The MMUs are responsible for transferring data between an SPU's local store and the system memory. In one embodiment, an MMU includes a direct memory access (DMA) controller configured to perform this function. PU 510 may program the MMUs to control which memory regions are available to each of the MMUs. By changing the mapping available to each of the MMUs, the PU may control which SPU has access to which region of system memory 520. In this manner, the PU may, for example, designate regions of the system memory as private for the exclusive use of a particular SPU. In one embodiment, the SPUs' local stores may be accessed by PU 510 as well as by the other SPUs using the memory map. In one embodiment, PU 510 manages the memory map for the common system memory 520 for all the SPUs. The memory map table may include PU 510's L2 Cache 515, system memory 520, as well as the SPUs' shared local stores.

In one embodiment, the SPUs process data under the control of PU 510. The SPUs may be, for example, digital signal processing cores, microprocessor cores, micro controller cores, etc., or a combination of the above cores. Each one of the local stores is a storage area associated with a particular SPU. In one embodiment, each SPU can configure its local store as a private storage area, a shared storage area, or an SPU may configure its local store as a partly private and partly shared storage.

For example, if an SPU requires a substantial amount of local memory, the SPU may allocate 100% of its local store to private memory accessible only by that SPU. If, on the other hand, an SPU requires a minimal amount of local memory, the SPU may allocate 10% of its local store to private memory and the remaining 90% to shared memory. The shared memory is accessible by PU 510 and by the other SPUs. An SPU may reserve part of its local store in order for the SPU to have fast, guaranteed memory access when performing tasks that require such fast access. The SPU may also reserve some of its local store as private when processing sensitive data, as is the case, for example, when the SPU is performing encryption/decryption.

While the computer system described in FIG. 5 is capable of executing the processes described herein, this computer system is simply one example of a computer system. Those skilled in the art will appreciate that many other computer system designs are capable of performing the processes described herein.

One of the preferred implementations of the invention is an application, namely, a set of instructions (program code) in a code module which may, for example, be resident in the random access memory of the computer. Until required by the computer, the set of instructions may be stored in another computer memory, for example, on a hard disk drive, or in removable storage such as an optical disk (for eventual use in a CD ROM) or floppy disk (for eventual use in a floppy disk drive), or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For a non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A computer-implemented method comprising:
identifying a plurality of unused slots in a plurality of pipelines, wherein each of the pipelines include instructions that are scheduled to execute on a processor, wherein the processor does not have hardware interrupt capabilities;
inserting, in a plurality of the identified unused slots, a conditional branch instruction, wherein the conditional branch instruction, when executed, branches on external data;
executing the inserted conditional branch instructions, wherein a predetermined memory location is checked each time each of the inserted conditional branch instructions is executed;
in response to no data being present in the predetermined memory location, the processor takes no action; and
in response to data being present in the predetermined memory location, the processor branches to a registered interrupt handler.

2. The method of claim 1 wherein an instruction stream corresponding to a software program is loaded in the plurality of pipelines, wherein the processor is one of a plurality of heterogeneous processors that share a common memory and a common bus, and wherein the predetermined memory location is included in the shared common memory, the method further comprising:
writing, from a different processor included in the plurality of heterogeneous processors, the data to the predetermined memory location.

3. The method of claim 2 further comprising:
executing the registered interrupt handler in response to the branching; and
reading, by the registered interrupt handler, the data stored in the predetermined memory location.

4. The method of claim 3 further comprising:
handling, after the branching, a request from an external program, wherein the external program wrote the data to the predetermined memory location;
after handling the request, clearing the predetermined memory location.

5. The method of claim 4 wherein, after clearing the predetermined memory location, the method further comprises:
resuming execution of the instruction stream.

6. The method of claim 1 wherein the conditional branch instruction is a Branch Indirect and Set Link if External Data (BISLED) instruction.

7. The method of claim 1 wherein the predetermined memory location is a register.

8. A information handling system comprising:
a plurality of heterogeneous processors included in a single silicon substrate, wherein a selected one of the processors includes a plurality of pipelines and the selected processor does not have hardware interrupt capabilities;
a common memory also included in the single silicon substrate, the common memory accessible by the heterogeneous processors using a common bus; and
a software tool that inserts conditional branch instructions in the plurality of pipelines, wherein the software tool, when executed by at least one of the processors, performs steps that include:
identifying a plurality of unused slots in the plurality of pipelines, wherein each of the pipelines include instructions that are scheduled to execute on the selected processor;
inserting, in a plurality of the identified unused slots, a conditional branch instruction, wherein the conditional branch instruction, when executed, branches on external data;
executing the instructions including the inserted conditional branch instructions, wherein a predetermined memory location in the common memory is checked each time each of the inserted conditional branch instructions is executed;
in response to no data being present in the predetermined memory location, the selected processor takes no action; and
in response to data being present in the predetermined memory location, the selected processor branches to a registered interrupt handler.

9. The information handling system of claim 8 wherein an instruction stream corresponding to a software program is loaded in the plurality of pipeline and the software tool performs a further step comprising:
writing, from a different processor included in the plurality of heterogeneous processors, the data to the predetermined memory location.

10. The information handling system of claim 9 wherein the software tool performs further steps comprising:
executing the registered interrupt handler in response to the branching; and
reading, by the registered interrupt handler, the data stored in the predetermined memory location.

11. The information handling system of claim 10 wherein the software tool performs further steps comprising:
handling, after the branching, a request from an external program, wherein the external program wrote the data to the predetermined memory location;
after handling the request, clearing the predetermined memory location.

12. The information handling system of claim 11 wherein, after clearing the predetermined memory location, the software tool performs further an additional step comprising:
resuming execution of the instruction stream.

13. The information handling system of claim 8 wherein the conditional branch instruction is a Branch Indirect and Set Link if External Data (BISLED) instruction, and wherein the predetermined memory location is a register.

14. A computer program product stored on a computer storage media that includes computer instructions that, when executed by an information handling system, causes the information handling system to perform steps comprising:
identifying a plurality of unused slots in a plurality of pipelines, wherein each of the pipelines include instructions that are scheduled to execute on a processor, wherein the processor does not have hardware interrupt capabilities;
inserting, in a plurality of the identified unused slots, a conditional branch instruction, wherein the conditional branch instruction, when executed, branches on external data;
executing the inserted conditional branch instructions, wherein a predetermined memory location is checked each time each of the inserted conditional branch instructions is executed;
in response to no data being present in the predetermined memory location, the processor takes no action; and
in response to data being present in the predetermined memory location, the processor branches to a registered interrupt handler.

15. The computer program product of claim 14 wherein an instruction stream corresponding to a software program is loaded in the plurality of pipelines, wherein the processor is one of a plurality of heterogeneous processors that share a common memory and a common bus, and wherein the predetermined memory location is included in the shared common memory, and wherein the instructions, when executed, cause the information handling system to perform further steps comprising:
writing, from a different processor included in the plurality of heterogeneous processors, the data to the predetermined memory location.

16. The computer program product of claim 15 wherein the instructions, when executed, cause the information handling system to perform further steps comprising:
executing the registered interrupt handler in response to the branching; and
reading, by the registered interrupt handler, the data stored in the predetermined memory location.

17. The computer program product of claim 16 wherein the instructions, when executed, cause the information handling system to perform further steps comprising:
handling, after the branching, a request from an external program, wherein the external program wrote the data to the predetermined memory location;
after handling the request, clearing the predetermined memory location.

18. The computer program product of claim 17 wherein, after clearing the predetermined memory location, and wherein the instructions, when executed, cause the information handling system to perform a further step comprising:
resuming execution of the instruction stream.

19. The computer program product of claim 14 wherein the conditional branch instruction is a Branch Indirect and Set Link if External Data (BISLED) instruction.

20. The computer program product of claim 14 wherein the predetermined memory location is a register.

* * * * *